(12) United States Patent
Chuang et al.

(10) Patent No.: US 9,240,519 B2
(45) Date of Patent: Jan. 19, 2016

(54) LIGHT-EMITTING ELEMENT COMPRISING A REFLECTIVE STRUCTURE WITH HIGH EFFICIENCY

(71) Applicant: EPISTAR CORPORATION, Hsinchu (TW)

(72) Inventors: Keng-Lin Chuang, Hsinchu (TW); Chun-Lung Tseng, Hsinchu (TW); Chih-Tsung Su, Hsinchu (TW); Ching-Hsing Shen, Hsinchu (TW); Chih-Hui Alston Liu, Hsinchu (TW); Yu-Ming Kun, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/162,614

(22) Filed: Jan. 23, 2014

(65) Prior Publication Data

US 2014/0209949 A1    Jul. 31, 2014

(30) Foreign Application Priority Data

Jan. 25, 2013    (TW) .............................. 102103055 A

(51) Int. Cl.
*H01L 33/00* (2010.01)
*H01L 33/10* (2010.01)
*H01L 33/20* (2010.01)
*H01L 33/46* (2010.01)

(52) U.S. Cl.
CPC ................ *H01L 33/20* (2013.01); *H01L 33/46* (2013.01)

(58) Field of Classification Search
CPC ............ H01L 33/465; H01L 29/66977; H01L 51/5265
USPC ............................................. 257/98, E33.069
See application file for complete search history.

(56) References Cited

U.S. PATENT DOCUMENTS

| | | | | |
|---|---|---|---|---|
| 2008/0121908 A1* | 5/2008 | Yuan et al. | | 257/94 |
| 2011/0031502 A1* | 2/2011 | Bergmann | | H01L 33/46 257/77 |
| 2011/0033962 A1* | 2/2011 | Kwon | | H01L 33/46 438/29 |
| 2011/0127549 A1* | 6/2011 | Lee et al. | | 257/88 |
| 2012/0025244 A1* | 2/2012 | Suh et al. | | 257/98 |
| 2013/0058102 A1* | 3/2013 | Lin | | 362/296.04 |
| 2013/0146925 A1* | 6/2013 | Suh et al. | | 257/98 |
| 2015/0228855 A1* | 8/2015 | Shatalov | | F21V 5/002 257/98 |

* cited by examiner

*Primary Examiner* — Julio J Maldonado
*Assistant Examiner* — Moazzam Hossain
(74) *Attorney, Agent, or Firm* — Muncy, Geissler, Olds & Lowe, P.C.

(57) ABSTRACT

A light-emitting element, comprises: a substrate; a light-emitting semiconductor stack over the substrate and comprising an active layer; and a Distributed Bragg reflective unit under the substrate comprising a first Distributed Bragg reflective structure under the substrate and comprising a first number of pairs of alternately stacked first sub-layers and second sub-layers, and a second Distributed Bragg reflective structure under the first Distributed Bragg reflective structure and comprising a second number of pairs of alternately stacked third sub-layers and fourth sub-layers, wherein the first number is different from the second number.

19 Claims, 13 Drawing Sheets

LIGHT-EMITTING ELEMENT COMPRISING A REFLECTIVE STRUCTURE WITH HIGH EFFICIENCY

TECHNICAL FIELD

The present application relates to a light-emitting element, and particularly to a light-emitting element comprising a reflective unit with high efficiency.

REFERENCE TO RELATED APPLICATION

This application claims the right of priority based on TW application Ser. No. 102103055, filed on Jan. 25, 2013, and the content of which is hereby incorporated by reference in its entirety.

DESCRIPTION OF BACKGROUND ART

Optoelectronic devices such as light-emitting diodes (LEDs) are now widely used in optical display devices, traffic lights, data storage devices, communication devices, lighting devices, and medical devices.

Besides, the light-emitting diode as mentioned above is able to be combined with other structures to form a light-emitting device. FIG. 13 schematically shows a conventional light-emitting device. As shown in FIG. 13, a conventional light-emitting device 6 comprises a submount 62 comprising an electrical circuit 64; a solder 66 on the submount 62, wherein the solder 66 is used for stabilizing an LED 61 on the submount 62 and thus renders the LED 61 electrically connected to the electrical circuit 64 of the submount 62, wherein the LED 61 comprises a substrate 63; and an electrical connecting structure 68 used for electrically connecting an electrode 65 of the LED 61 to the electrical circuit 64 of the submount 62; wherein the submount 62 is a lead frame or a large-scale mounting substrate.

SUMMARY OF THE DISCLOSURE

A light-emitting element, comprises: a substrate; a light-emitting semiconductor stack over the substrate and comprising an active layer; and a Distributed Bragg reflective unit under the substrate comprising a first Distributed Bragg reflective structure under the substrate and comprising a first number of pairs of alternately stacked first sub-layers and second sub-layers, and a second Distributed Bragg reflective structure under the first Distributed Bragg reflective structure and comprising a second number of pairs of alternately stacked third sub-layers and fourth sub-layers, wherein the first number is different from the second number.

DETAILED DESCRIPTION OF PREFERRED EMBODIMENTS

Figure 1:
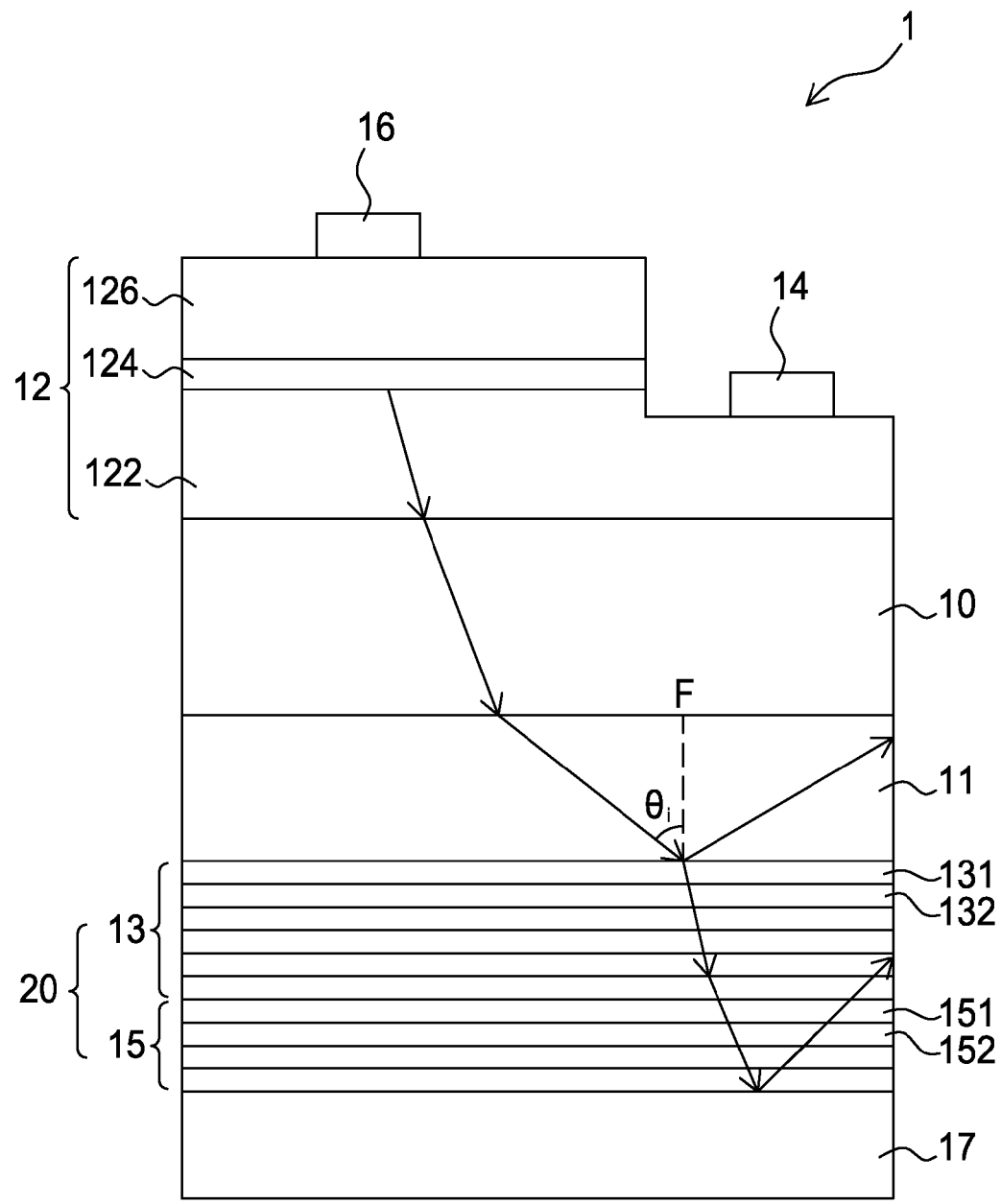
FIG. 1 is a cross-sectional diagram of a light-emitting element in accordance with one of the embodiments of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIG. 1 is a cross-sectional diagram of a light-emitting element in accordance with one of the embodiments of the present application. As shown in FIG. 1, a light-emitting element 1 comprising a substrate 10; a light-emitting semiconductor stack 12 on the substrate 10; a window layer 11 under the substrate 10; a first Distributed Bragg reflective structure 13 under the window layer 11; a second Distributed Bragg reflective structure 15 under the first Distributed Bragg reflective structure 13; and a reflective layer 17 under the second Distributed Bragg reflective structure 15. The light-emitting semiconductor stack 12 comprises a first semiconductor layer 122 on the substrate 10; an active layer 124 on the first semiconductor layer 122; and a second semiconductor layer 126 on the active layer 124. The light-emitting element 1 further comprises a first electrode 14 and a second electrode 16, wherein the first electrode 14 is on the first semiconductor layer 122 and the second electrode 16 is on the second semiconductor layer 126. Preferably, the electrical polarity of the first electrode 14 is different from that of the second electrode 16.

The first electrode 14 and/or the second electrode 16 are for receiving an external voltage and comprise transparent conductive material or metal material. The transparent conductive material comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), zinc oxide (ZnO), AlGaAs, GaN, GaP, GaAs, GaAsP, indium zinc oxide (IZO), or diamond-like carbon (DLC). The metal material comprises Al Cr, Cu, Sn, Au, Ni, Ti, Pt, Pb, Zn, Cd, Sb, Co, or alloys thereof.

The light-emitting semiconductor stack 12 can be directly grown on the substrate 10, or can be fixed on the substrate 10 by a bonding layer (not shown). The material of the light-emitting semiconductor stack 12 can be semiconductor material comprising one or more elements selected from the group consisting of Ga, Al, In, P, N, Zn, Cd, and Se. The electrical polarity of the first semiconductor layer 122 is different from that of the second semiconductor layer 126 and thus the first semiconductor layer 122 and the second semiconductor layer 126 generate electrons and holes respectively. The active layer 124 emits light having one or more colors and the structure of the active layer 124 can be single heterostructure (SH), double heterostructure (DH), double-side double heterostructure (DDH), multi-quantum well (MQW) or quantum dots.

The substrate 10 is used for supporting the light-emitting semiconductor stack 12 and other layers or structures thereon. The material of the substrate 10 can be transparent material comprising sapphire, diamond, glass, epoxy, quartz, acrylics, $Al_2O_3$, GaAs, ZnO or AlN, wherein sapphire and GaAs can be used for growing a light-emitting semiconductor stack.

The window layer 11 is substantially transparent to the light emitted from the light-emitting semiconductor stack 12 and thus increases the light extraction efficiency. The material of the window layer 11 can be insulating material or conductive material. The insulating material comprises polyimide (PI), benzocyclobutene (BCB), prefluorocyclobutane (PFCB), MgO, epoxy, Su8, acrylic resin, cyclic olefin polymers (COC), polymethylmethacrylate (PMMA), polyethylene terephthalate (PET), polycarbonate (PC), polyetherimide, fluorocarbon polymer, glass, $Al_2O_3$, $SiO_x$, $TiO_2$, $Ta_2O_5$, $SiN_x$, spin-on glass or tetraethyl orthosilicate (TEOS). The conductive material comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide(GZO),zinc oxide (ZnO), magnesium oxide (MgO), AlGaAs, GaN, GaP, or indium zinc oxide (IZO).

The first Distributed Bragg reflective structure 13 and the second Distributed Bragg reflective structure 15 form a Distributed Bragg reflective unit 20, wherein the first Distributed Bragg reflective structure 13 comprises a first number of pairs of reflective layers and the second Distributed Bragg reflective structure 15 comprises a second number of pairs of reflective layers, wherein the first number is different from the second number. For example, the first number is larger than the second number. In another embodiment, a thickness of the first Distributed Bragg reflective structure 13 is larger than a thickness of a second Distributed Bragg reflective structure 15. Each pair of the reflective layers of the first Distributed Bragg reflective structure 13 comprises a first sub-layer 131 and a second sub-layer 132. In the present embodiment, the first sub-layer 131 of each pair is between the window layer 11 and the second Distributed Bragg reflective structure 15, and the second sub-layer 132 of each pair is between the first sub-layer 131 and the second Distributed Bragg reflective structure 15. Specifically, each first sub-layer 131 is closer to the substrate 10 than the second sub-layer 132 in a same pair of the first Distributed Bragg reflective structure 13. Besides, a thickness of the first sub-layer 131 is different from a thickness of the second sub-layer 132, for example, a thickness of the first sub-layer 131 is smaller than a thickness of the second sub-layer 132. Each pair of the reflective layers of the second Distributed Bragg reflective structure 15 comprises a third sub-layer 151 and a fourth sub-layer 152. In the present embodiment, the third sub-layer 151 of each pair is between the first Distributed Bragg reflective structure 13 and the reflective layer 17, and the fourth sub-layer 152 of each pair is between the third sub-layer 151 and the reflective layer 17. Specifically, each third sub-layer 151 is closer to the substrate 10 than the fourth sub-layer 152 in a same pair of the second Distributed Bragg reflective structure 15. Besides, a thickness of the third sub-layer 151 is different from a thickness of the fourth sub-layer 152, for example, a thickness of the third sub-layer 151 is smaller than a thickness of the fourth sub-layer 152. In another embodiment, the thickness of the first sub-layer 131 is larger than the thickness of the third sub-layers 151, and/or the thickness of the second sub-layer 132 is larger than the thickness of the fourth sub-layer 152.

Figure 2:
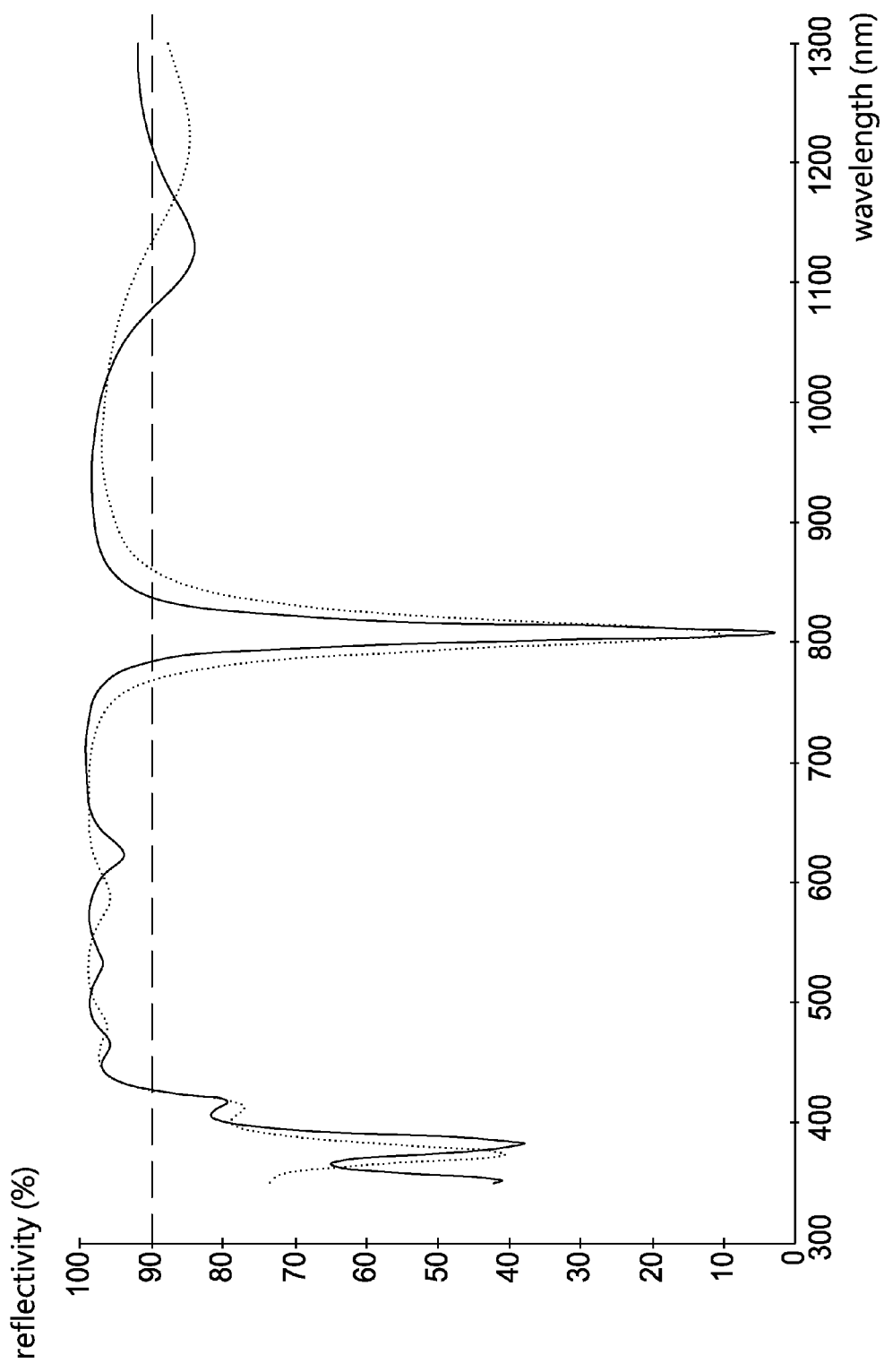
FIG. 2 is a graph showing a relation between wavelength and reflectivity of a Distributed Bragg reflective unit in accordance with one of the embodiments of the present application and of a Distributed Bragg reflective unit comprising a first number equal to a second number.
Figure 3:
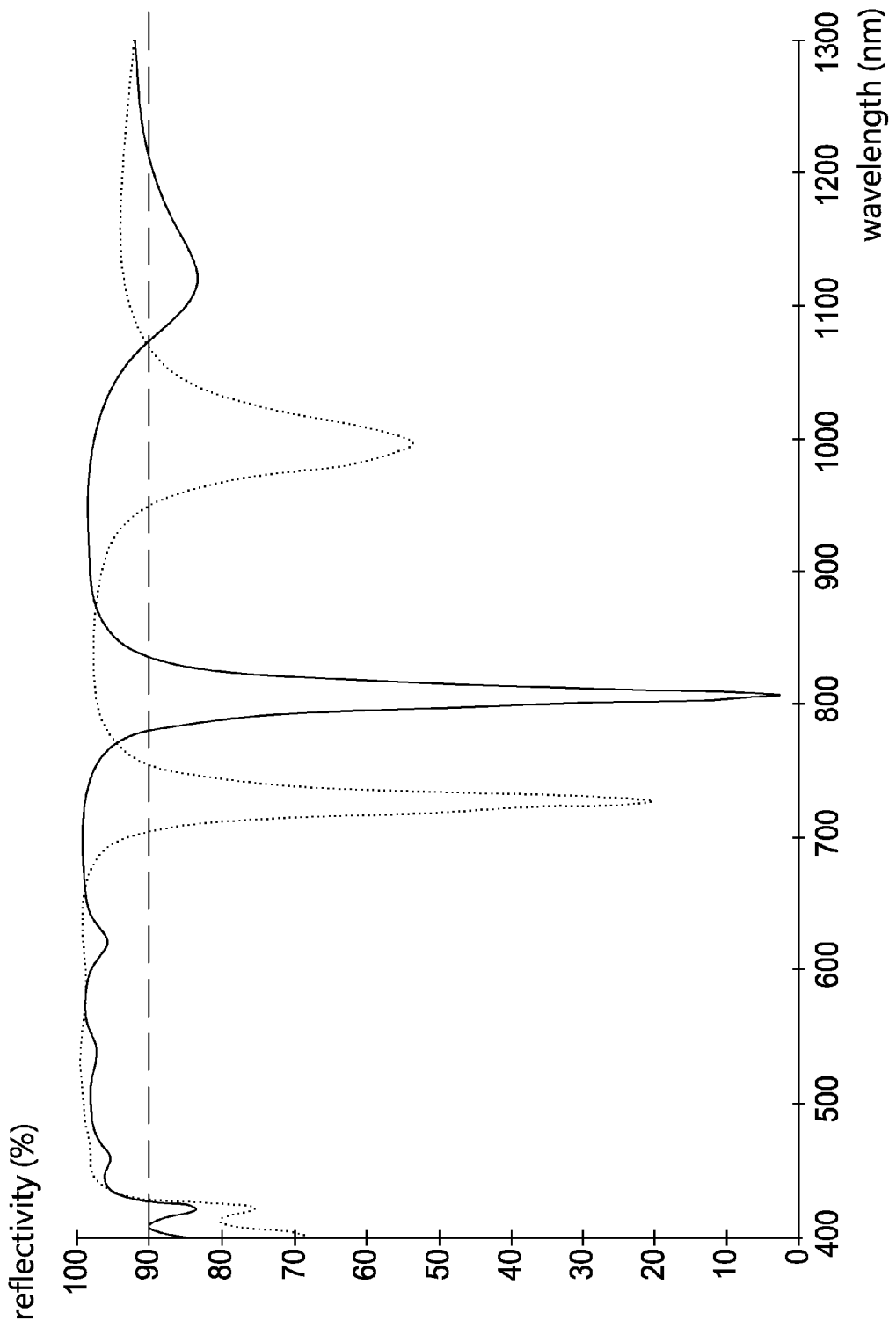
FIG. 3 is a graph showing a relation between wavelength and reflectivity of a Distributed Bragg reflective unit in accordance with one of the embodiments of the present application and of a Distributed Bragg reflective unit comprising a first number less than a second number.
Figure 4:
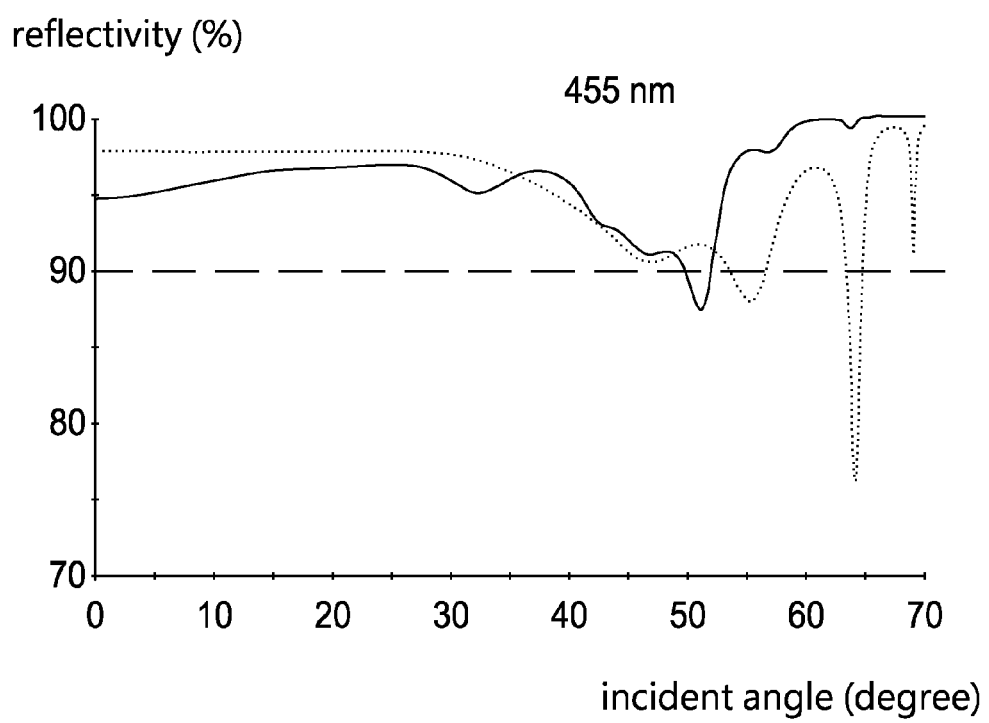
FIG. 4 is a graph showing a relation between incident angle and reflectivity of a Distributed Bragg reflective unit in accordance with one of the embodiments of the present application and of a Distributed Bragg reflective unit comprising a first number equal to a second number, wherein the incident angle ranging from 0 degree to 70 degrees.

FIG. 2 is a graph showing a relation between wavelength and reflectivity of different Distributed Bragg reflective units. Specifically, a solid line represents a relation between wavelength and reflectivity of the Distributed Bragg reflective unit 20 comprising the first number larger than the second number, and the dotted line represents a relation between wavelength and reflectivity of the Distributed Bragg reflective unit comprising a first number equal to a second number. With regard to the solid line, a reflectivity higher than 90% is at a wavelength ranging from about 420 nm to about 790 nm. The reflectivity is decreased to less than 90% at wavelengths longer than 790 nm and is increased to larger than 90% again at a wavelength ranging from about 820 nm to about 1080 nm and at wavelengths longer than 1180 nm. With regard to the dotted line, a reflectivity higher than 90% is at a wavelength ranging from about 420 nm to about 770 nm. The reflectivity is decreased to less than 90% at wavelengths longer than 770 nm and is increased to larger than 90% again at a wavelength ranging from about 850 nm to about 1150 nm, and is decreased to less than 90% at wavelengths longer than 1150 nm. From the result, the solid line shows a reflectivity higher than 90% over a broader wavelength range than the dotted line does. Accordingly, the Distributed Bragg reflective unit 20 comprising the first number larger than the second number comprises a reflectivity higher than 90% over a broader wavelength range than a wavelength range of a Distributed Bragg reflective unit comprising a first number equal to a second number. Therefore, the Distributed Bragg reflective unit 20 comprising the first number larger than the second number has higher light extraction efficiency. FIG. 3 is a graph showing a relation between wavelength and reflectivity of different Distributed Bragg reflective units. Specifically, a solid line represents a relation between wavelength and reflectivity of the Distributed Bragg reflective unit 20 comprising the first number larger than the second number, and the dotted line represents a relation between wavelength and reflectivity of the Distributed Bragg reflective unit comprising a first number less than a second number. With regard to the solid line, a reflectivity higher than 90% is at a wavelength ranging from about 420 nm to about 790 nm. The reflectivity is decreased to less than 90% at wavelengths longer than 790 nm and is increased to larger than 90% again at a wavelength ranging from about 820 nm to about 1080 nm and at wavelengths longer than 1180 nm. With regard to the dotted line, a reflectivity higher than 90% is at a wavelength ranging from about 420 nm to about 710 nm. The reflectivity is decreased to less than 90% at wavelengths longer than 710 nm and is increased to larger than 90% again at a wavelength ranging from about 760 nm to about 950 nm and at wavelengths longer than 1060 nm. From the result, the solid line shows a reflectivity higher than 90% over a broader wavelength range than the dotted line does. Accordingly, the Distributed Bragg reflective unit 20 comprising the first number larger than the second number comprises a reflectivity higher than 90% over a broader wavelength range than the wavelength range of the Distributed Bragg reflective unit comprising a first number less than a second number. Thus, the Distributed Bragg reflective unit 20 comprising the first number larger than the second number has higher light extraction efficiency. FIG. 4 is a graph showing a relation between incident angle θi and reflectivity of different Distributed Bragg reflective units. Specifically, the solid line represents a relation between incident angle θi and reflectivity of the Distributed Bragg reflective unit 20 comprising the first number larger than the second number while the dotted line represents a relation between incident angle θi and reflectivity of the Distributed Bragg reflective unit comprising the first number equal to the first number, wherein the incident angle θi ranging from 0 degree to 70 degrees. As shown in FIG. 2 and FIG. 4, with regard to the solid line, a reflectivity higher than 90% is at an incident angle θi ranging from about 0 degree to about 50 degrees. The reflectivity is decreased to less than 90% at an incident angle θi ranging from about 50 degrees to about 52 degrees and is increased to larger than 90% again at an incident angle θi ranging from about 52 degrees to about 70 degrees. With regard to the dotted line, at an incident angle θi ranging from about 0 degree to about 54 degrees, the reflectivity is higher than 90%. At an incident angle θi ranging from about 54 degrees to about 56 degrees, the reflectivity is decreased to less than 90%. The reflectivity is increased to larger than 90% again at an incident angle θi ranging from about 56 degrees to about 64 degrees, and is decreased to less than 90% at an incident angle θi ranging from about 64 degrees to about 65 degrees. At an incident larger than 65 degrees, the reflectivity is increased to larger than 90%. The result shows that the solid line comprises the reflectivity higher than 90% over a wider incident angle θi range than the dotted line does. As a result, the Distributed Bragg reflective unit 20 comprising the first number larger than the second number comprises a reflectivity higher than 90% at a wider incident angle θi range than the incident angle θi range of the Distributed Bragg reflective unit comprising a first number equal to a second number. At a larger incident angle θi such as at an incident angle θi ranging from about 52 degrees to about 70 degrees, the Distributed Bragg reflective unit 20 comprising the first number larger than the second number has a higher reflectivity than the reflectivity of the Distributed Bragg reflective unit comprising a first number equal to a second number. Therefore, the Distributed Bragg reflective unit 20 comprising the first number larger than the second number has higher light extraction efficiency.

The first Distributed Bragg reflective structure 13 and/or the second Distributed Bragg reflective structure 15 comprises a material substantially transparent to the light emitted from the light-emitting semiconductor stack 12, wherein the material can be insulating material or conductive material. The insulating material comprises polyimide (PI), benzocyclobutene (BCB), prefluorocyclobutane (PFCB), MgO, epoxy, Su8, acrylic resin, cyclic olefin polymers (COC), polymethylmethacrylate (PMMA), polyethylene terephthalate (PET), polycarbonate (PC), polyetherimide, fluorocarbon polymer, glass, $Al_2O_3$, $SiO_x$, $TiO_2$, $Ta_2O_5$, $SiN_x$, spin-on glass or tetraethyl orthosilicate (TEOS). The conductive material comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide(GZO), zinc oxide (ZnO), magnesium oxide (MgO), AlGaAs, GaN, GaP, or indium zinc oxide (IZO). In one of the embodiments, the material of the first sub-layer 131 is different from the material of the second sub-layer 132, and/or the material of the third sub-layer 151 is different from the material of the fourth sub-layer 152. In another embodiment, each pair of the reflective layers comprises alternate sub-layers comprising high refractive index material and sub-layers comprising low refractive-index material. For example, the first sub-layer 131 and/or the third sub-layer 151 comprise high refractive index material comprising $TiO_2$, $HfO_2$, $ZnO$, $Ta_2O_5$, $Nb_2O_5$ or combinations thereof. The second sub-layer 132 and/or the fourth sub-layer 152 comprise low refractive index material comprising $SiO_2$, $LaF_3$, $MgF_2$, $NaF$, $Na_3AlF_6$, $CaF_2$ or combinations thereof. The high refractive index material herein is defined as a material with a refractive index higher than 2 while the low refractive index material herein is defined as a material with a refractive index less than 1.9.

The reflective layer 17 reflects the light emitted from the light-emitting semiconductor stack 12. The material of the reflective layer 17 comprises Cu, Al, Sn, Au, Ag, Pb, Ti, Ni, Pt, W or alloys thereof.

Figure 5:
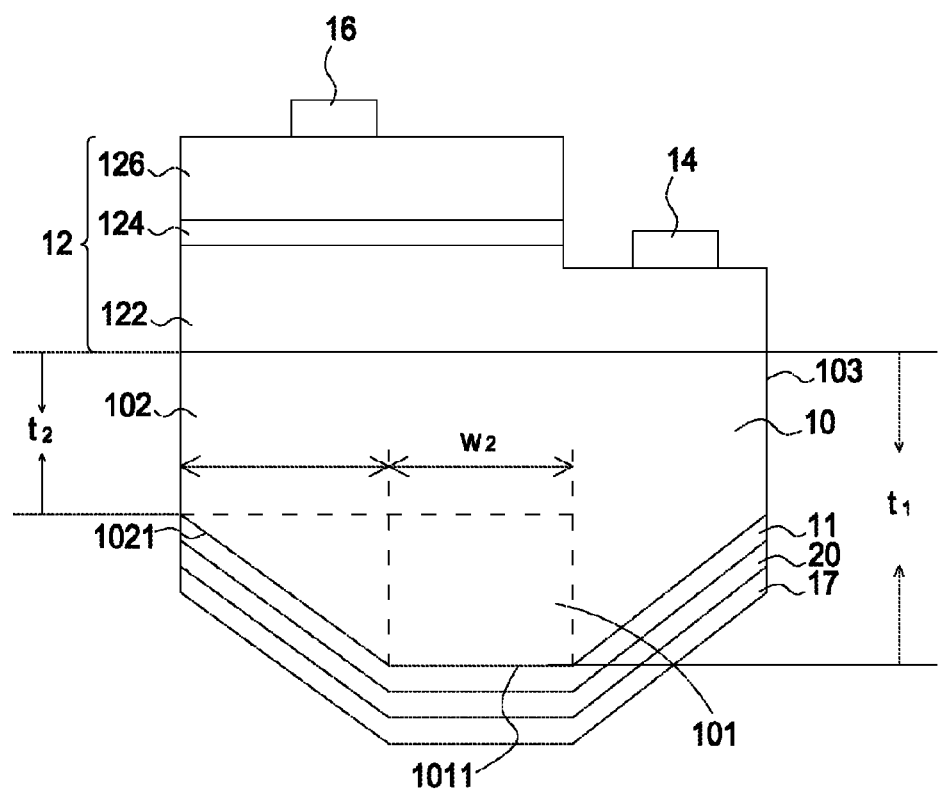
FIG. 5 is a cross-sectional diagram of a light-emitting element in accordance with one of the embodiments of the present application.

Referring to FIG. 5, in another embodiment of the present application, the substrate 10 comprises a first portion 101 and a second portion 102 surrounding the first portion 101, wherein the second portion 102 has a thickness $t_2$ smaller than a thickness $t_1$ of the first portion 101. Preferably, the second portion 102 comprises a minimum thickness $t_2$ not more than 80% of a thickness $t_1$ of the first portion 101. A method for thinning the substrate 10 to form the second portion 102 comprises laser or dicing and following by removing the byproducts by water or etchant. Specifically, a direction of determining the thickness herein is defined as parallel to the direction of epitaxial growth of the light-emitting semiconductor stack 12. In the present embodiment, the first portion 101 and the second portion 102 each comprises a flat surface 1011, 1021 away from the light-emitting semiconductor stack 12 and the flat surface 1021 of the second portion 102 is inclined relatively to the flat surface 1011 of the first portion 101. More preferably, the window layer 11, the Distributed Bragg reflective unit 20 and the metal reflective layer 17 are conformably formed on the substrate 10, and thus the window layer 11, the Distributed Bragg reflective unit 20 and the metal reflective layer 17 comprise similar profiles to the profile of the substrate 10. Specifically, the window layer 11, the metal reflective layer 17 and the Distributed Bragg reflective unit 20 cover the flat surface 1021 of the second portion 102 and cover the flat surface 1011 of the first portion 101 of the substrate 10. More preferably, the window layer 11, the metal reflective layer 17 and the Distributed Bragg reflective unit 20 uncover an outermost side wall 103 of the substrate 10 and thus expose the outermost side wall 103. The second portion 102 comprises a maximum width $w_1$ not less 3% of the maximum width of the substrate 10. More preferably, the maximum width $w_1$ ranges from 3% to 10% of the maximum width of the substrate 10. The first portion 101 comprises a width $w_2$ not more than 94% of the maximum width of the substrate 10. More preferably, the width $w_2$ ranges from 80% to 94% of the maximum width of the substrate 10. In the present embodiment, the thickness of the second portion 102 gradually increases along a direction from the outermost side wall 103 of the substrate 10 toward the first portion 101. The maximum width $w_1$ and the minimum thickness have an advantage of reducing an amount of adhesive covering the outermost side wall 103 while bonding to a submount, which will be described subsequently. Furthermore, in this embodiment, the first electrode 14 and the second electrode 16 are over a same side of the substrate 10, and more preferably, the first electrode 14 and the second electrode 16 are over a same side of the substrate 10 opposite to the flat surface 1011 of the first portion 101 and to the flat surface 1021 of the second portion 102.

Figure 6:
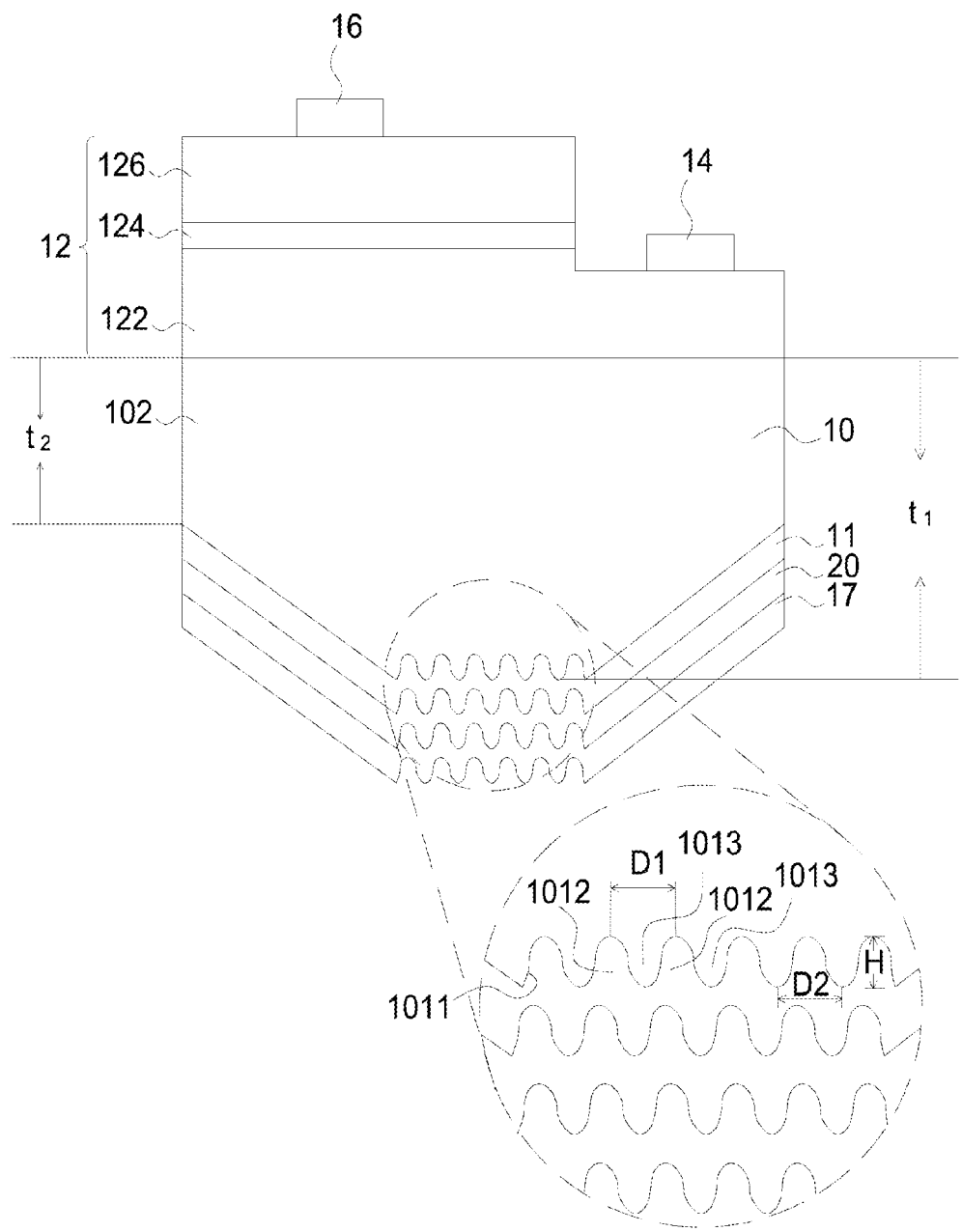
FIG. 6 is a cross-sectional diagram of a light-emitting element in accordance with one of the embodiments of the present application.

Referring to FIG. 6, in another embodiment of the present application, the first portion 101 comprises a textured surface 1011 comprising alternate concave structures 1012 and convex structures 1013. Specifically, a distance D1 between two adjacent concave structures 1012 and a distance D2 between two adjacent convex structures are not less than 2 μm. Preferably, the distance D1 between two adjacent concave structures 1012 and the distance D2 between two adjacent convex structures 1013 range from 2 μm to 10 μm. The distance D1 between two adjacent concave structures 1012 may be different form the distance D2 between two adjacent convex structures 1013. More preferably, the window layer 11, the Distributed Bragg reflective unit 20 and the metal reflective layer 17 are conformably formed on the substrate 10, and thus the window layer 11, the Distributed Bragg reflective unit 20 and the metal reflective layer 17 comprise similar profiles to the profile of the substrate 10. For example, Distributed Bragg reflective unit 20 comprises a textured surface right under the textured surface 1011 of the first portion 101. Specifically, a method for forming the concave structures 1012 and convex structures 1013 comprises laser or dicing and following by removing the byproducts by water or etchant. Besides, a perpendicular height H of the concave structures and/or of the concave structures is not less than 8 μm. Preferably, the perpendicular height H is not more than 20% of a maximum thickness $t_1$ of the first portion 101.

Figure 7:
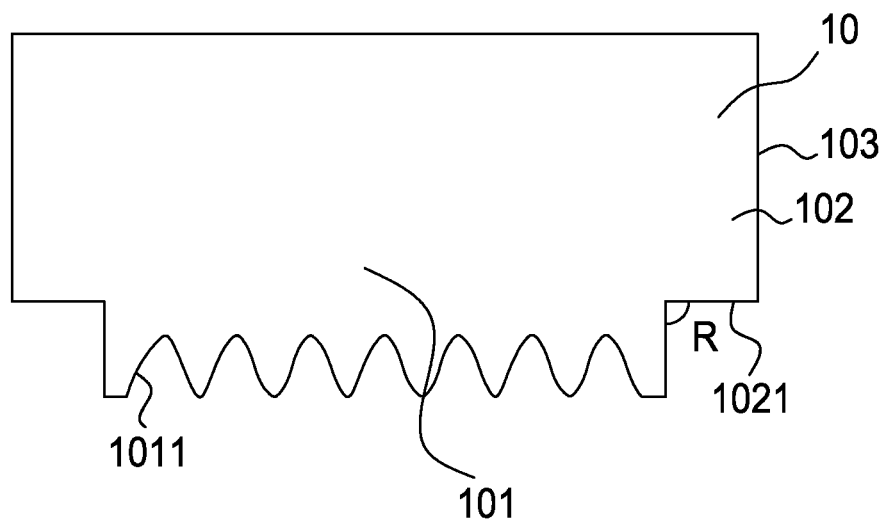
FIG. 7 is a cross-sectional diagram of a light-emitting element in accordance with one of the embodiments of the present application.

Referring to FIG. 7, in another embodiment of the present application, the substrate 10 comprises an angle R between the first portion 101 and the second portion 10, wherein the angle R is larger than 90 degrees, and preferably, the angle R ranges from 90 degrees to 180 degrees. Specifically, the second portion 10 comprises a flat surface 1021 substantially perpendicular to the outermost side wall 103.

Figure 8:
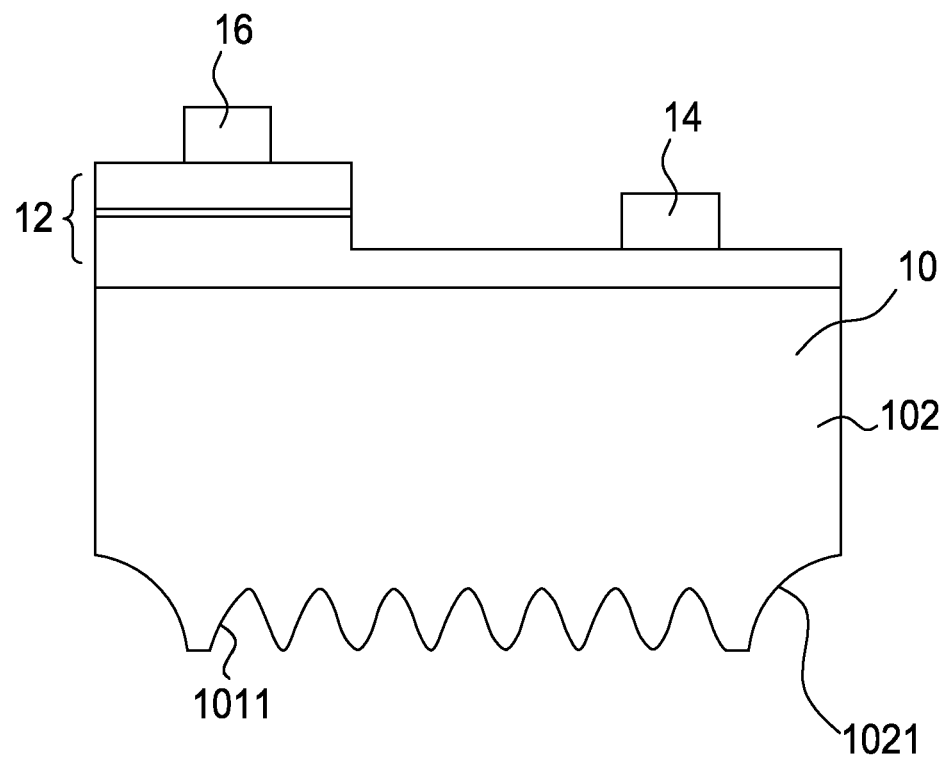
FIG. 8 is a cross-sectional diagram of a light-emitting element in accordance with one of the embodiments of the present application.

Referring to FIG. 8, in another embodiment of the present application, the second portion 102 comprises an arc surface 1021 concavely bending toward the light-emitting semiconductor stack 12.

Figure 9:
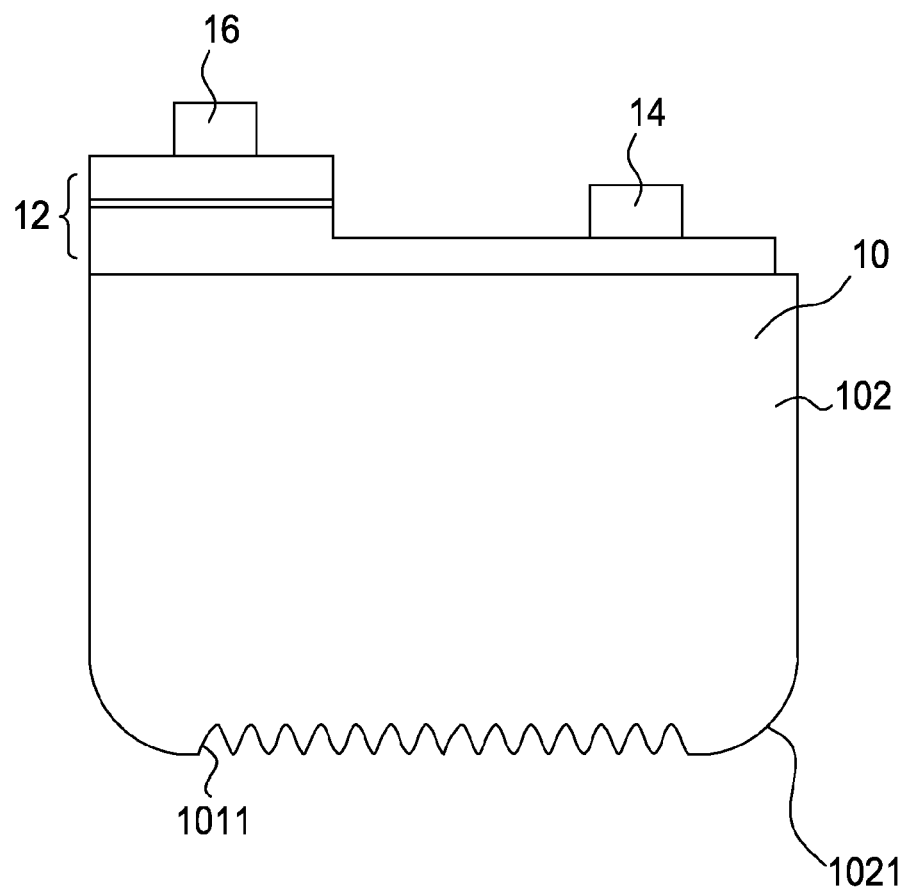
FIG. 9 is a cross-sectional diagram of a light-emitting element in accordance with one of the embodiments of the present application.

Referring to FIG. 9, in another embodiment of the present application, the second portion 102 comprises an arc surface 1021 convexly bending e away from the light-emitting semiconductor stack 12.

Figure 10:
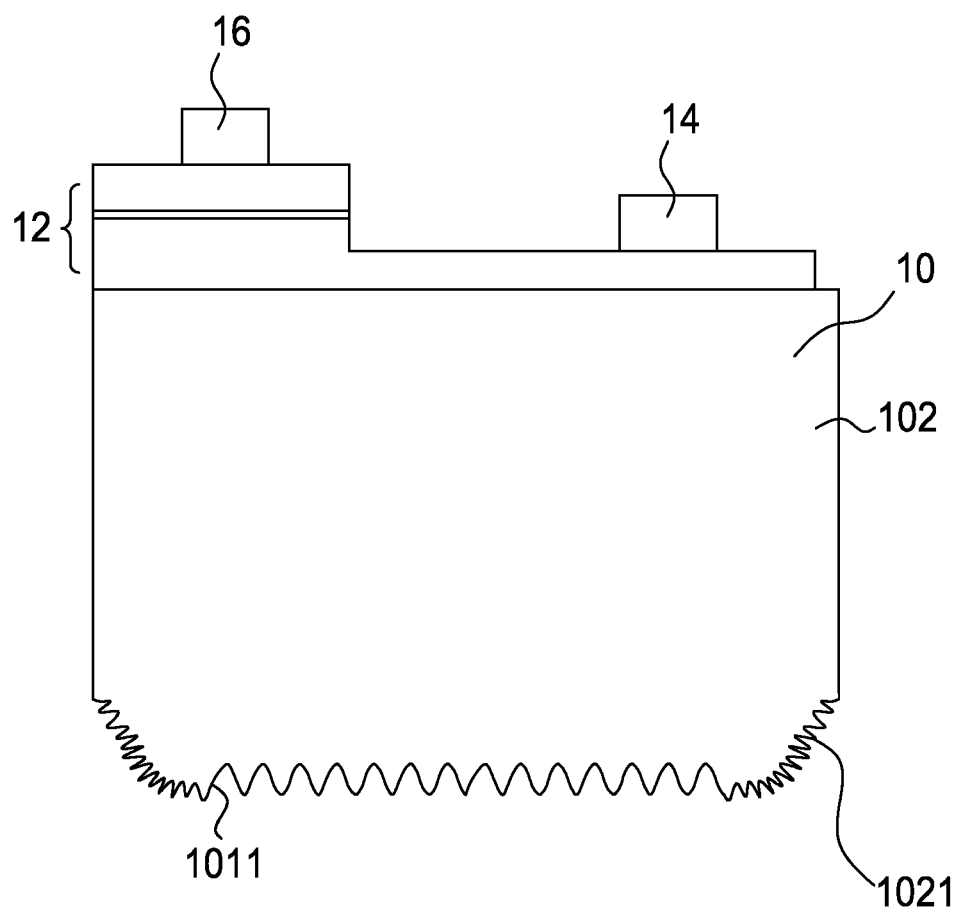
FIG. 10 is a cross-sectional diagram of a light-emitting element in accordance with one of the embodiments of the present application.

Referring to FIG. 10, in another embodiment of the present application, the second portion 102 comprises a textured surface 1021 as well.

Figure 11:
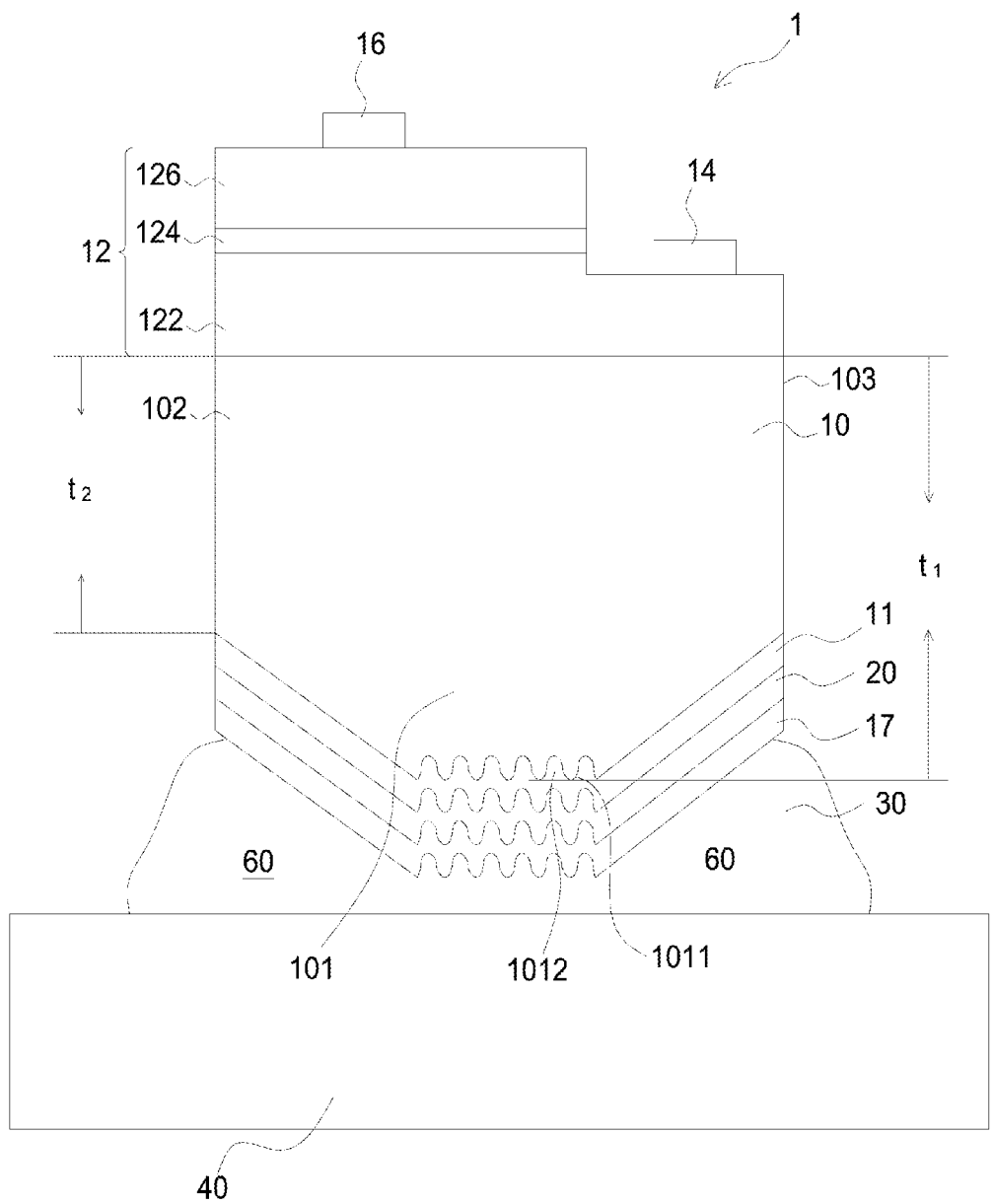
FIG. 11 is a cross-sectional diagram of a light-emitting element in accordance with one of the embodiments of the present application.

Referring to FIG. 11, in another embodiment of the present application, the light-emitting element 1 is bonded to a submount 40 by an adhesive 30. Because second portion 102 has a thickness $t_2$ smaller than a thickness $t_1$ of the first portion 101, a cavity 60 is formed between the second portion 102 and the submount 40. Therefore, an excessive amount of the adhesive 30 can be filled in the cavity 60 and the amount of the adhesive 30 beyond the outermost side wall 103 of the substrate 10 is less. As a result, the amount of the adhesive 30 covering the outermost side wall 103 of the substrate 10 is significantly reduced and thus the outermost side wall 103 is exposed. Accordingly, the light extraction efficiency of the light-emitting element 1 of the present application is improved. Besides, because the first portion 101 of the substrate 10 comprises a textured surface 1011, a more amount of the adhesive 30 can be filled in the concave structures 1012 as well, and therefore the substrate 10 is more stably bonded to the submount 40. Furthermore, the surface area of the substrate 10 is increased since the first portion 101 of the substrate 10 comprises a textured surface 1011 and/or since the second portion 102 comprises a textured surface 1021, and thus the heat dissipation of the light-emitting element is improved.

Figure 12:
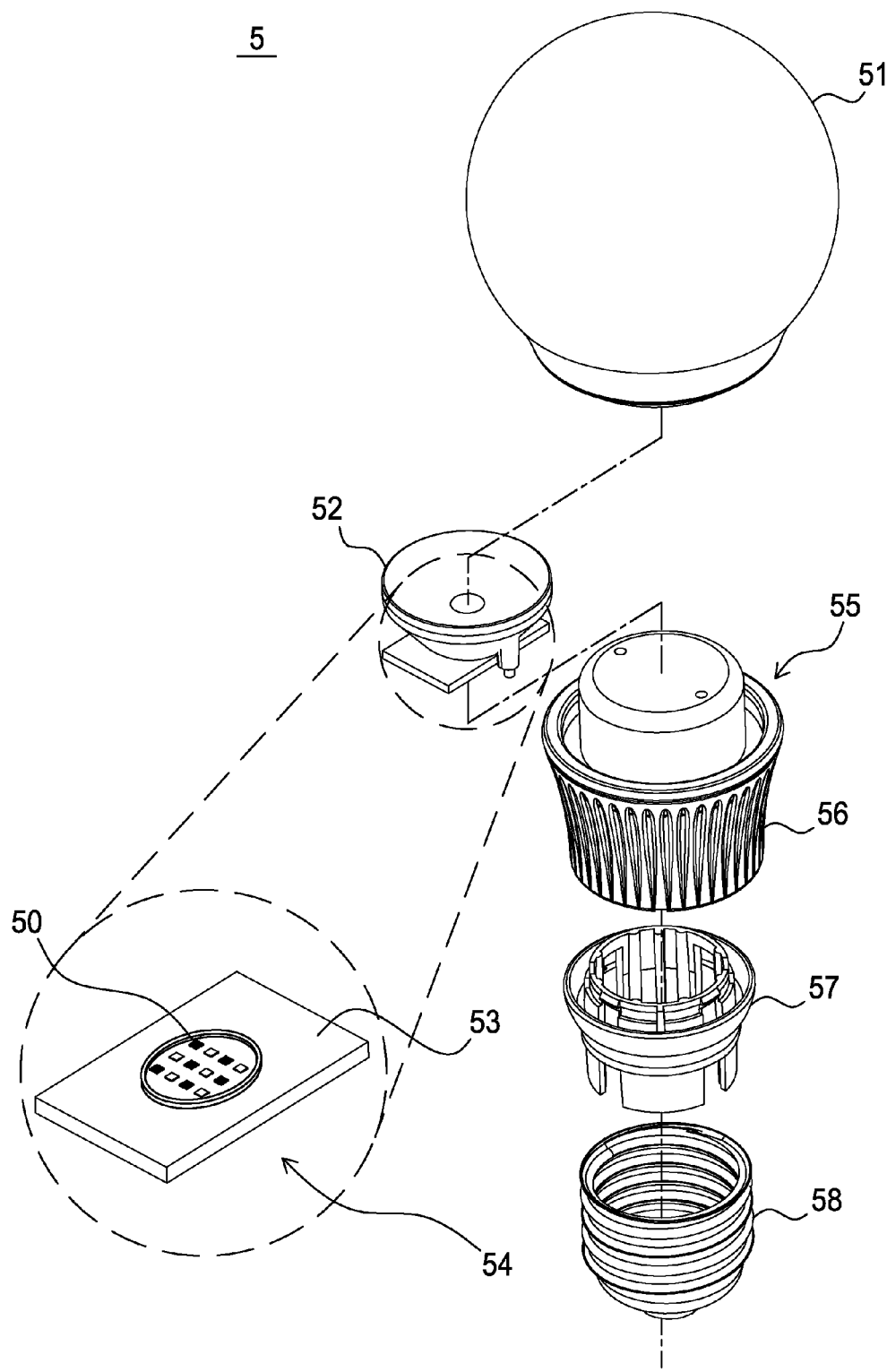
FIG. 12 is an exploded view of a light bulb in accordance with one of the embodiments of the present application.
Figure 13:
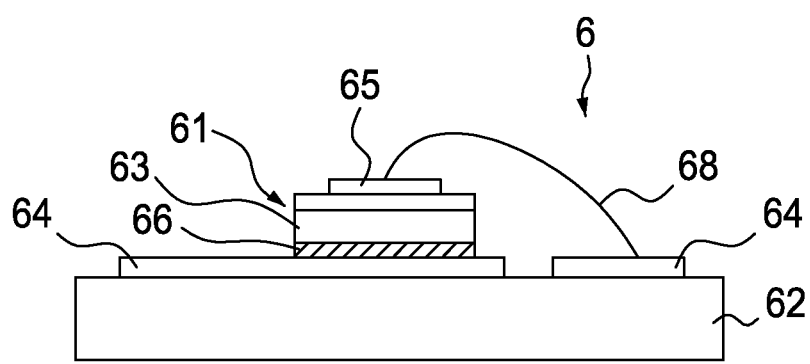
FIG. 13 schematically shows a conventional light-emitting device.

FIG. 12 is an exploded view of a light bulb 5 in accordance with one of the embodiments of the present application. The light bulb 5 comprises a lamp 51, a lens 52 disposed in the lamp 51, a lighting module 54 disposed under the lens 52, a lamp holder 55 comprising a heat sink 56, wherein the lighting module 54 is used for holding the lighting module 54, a connecting part 57, and an electrical connector 58, wherein the connecting part 57 connects the lamp holder 55 to the electrical connector 58. The lighting module 54 comprises a carrier 53 and multiple light-emitting elements 50 of any one of the embodiments as mentioned above, wherein the multiple light-emitting elements 50 are on the carrier 53.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting element, comprising:
   a substrate, comprising a first portion and a second portion surrounding the first portion, wherein the second portion has a vertical thickness smaller than a vertical thickness of the first portion, and the first portion comprises a textured surface comprising alternate concave structures and convex structures;
   a light-emitting semiconductor stack over the substrate and comprising an active layer; and
   a Distributed Bragg reflective unit under the substrate and comprising a first Distributed Bragg reflective structure conformably formed on the textured surface of the substrate and comprising a first number of pairs of alternately stacked first sub-layers and second sub-layers, and
   a second Distributed Bragg reflective structure conformably formed on the first Distributed Bragg reflective structure and comprising a second number of pairs of alternately stacked third sub-layers and fourth sub-layers, wherein the first number is different from the second number.

2. The light-emitting element according to claim 1, further comprising a metal reflective layer under the second Distributed Bragg reflective structure.

3. The light-emitting element according to claim 1, wherein the light-emitting semiconductor stack comprises III-nitride material, III-phosphide material, or III-arsenide material.

4. The light-emitting element according to claim 1, wherein a total thickness of the first Distributed Bragg reflective structure is larger than a total thickness of the second Distributed Bragg reflective structure.

5. The light-emitting element according to claim 1, wherein each first sub-layer is closer to the substrate than the second sub-layer in a same pair of the first Distributed Bragg reflective structure, wherein a thickness of the first sub-layer is smaller than a thickness of the second sub-layer.

6. The light-emitting element according to claim 5, wherein a refractive index of the first sub-layer is larger than that of the second sub-layer.

7. The light-emitting element according to claim 1, wherein each third sub-layer of is closer to the substrate than the fourth sub-layer in a same pair of the second Distributed Bragg reflective structure, wherein a thickness of the third sub-layer is smaller than a thickness of the fourth sub-layer.

8. The light-emitting element according to claim 7, wherein a refractive index of the third sub-layer is larger than that of the fourth sub-layer.

9. The light-emitting element according to claim 1, wherein each first sub-layer of is closer to the substrate than the second sub-layer in a same pair of the first Distributed Bragg reflective structure, and each third sub-layer of the pairs is closer to the substrate than the fourth sub-layer in a same pair of the second Distributed Bragg reflective structure, wherein a thickness of the first sub-layer is larger than a thickness of the third sub-layer, and a thickness of the second sub-layer is larger than a thickness of the fourth sub-layer.

10. The light-emitting element according to claim 9, wherein a refractive index of the first sub-layer or a refractive index of the third sub-layer is larger than 2.

11. The light-emitting element according to claim 1, wherein the second portion is devoid of any textured surfaces.

12. The light-emitting element according to claim 9, wherein a material of the second sub-layer or a material of the fourth sub-layer comprises $SiO_2$, $LaF_3$, $MgF_2$, $NaF$, $Na_3AlF_6$, $CaF_2$, or the combinations thereof.

13. The light-emitting element according to claim 1, further comprising a window layer between the substrate and the first Distributed Bragg reflective structure.

14. The light-emitting element according to claim 1, wherein a distance between two adjacent concave structures ranges from 2 μm to 10 μm.

15. The light-emitting element according to claim 1, wherein the second portion comprises a minimum thickness not more than 80% of a maximum thickness of the first portion.

16. The light-emitting element according to claim 15, wherein a perpendicular height taken to the top surface of the substrate, of one of the convex structures is not more than 20% of the thickness of the maximum thickness of the first portion.

17. The light-emitting element according to claim 16, wherein the perpendicular height is not less than 8 μm.

18. The light-emitting element according to claim 1, further comprising a metal reflective layer conformably formed on the second Distributed Bragg reflective structure.

19. The light-emitting element according to claim 18, wherein the metal reflective layer covers the textured surface of the substrate.

* * * * *